United States Patent [19]

Bennett, Jr.

[11] 4,127,824
[45] Nov. 28, 1978

[54] SAMPLING FILTER-DETECTOR

[75] Inventor: Robert McK. Bennett, Jr., West Dundee, Ill.

[73] Assignee: Motorola, Inc., Schaumburg, Ill.

[21] Appl. No.: 784,211

[22] Filed: Apr. 4, 1977

[51] Int. Cl.$^2$ .................. H03K 9/06; H03K 17/16
[52] U.S. Cl. .................. 328/138; 328/134; 328/151; 328/167
[58] Field of Search ............ 328/138, 165, 167, 151

[56] References Cited

U.S. PATENT DOCUMENTS

| | | | |
|---|---|---|---|
| 3,493,876 | 2/1970 | Zimmerman | 328/167 |
| 3,537,019 | 10/1970 | Reichard | 328/165 |
| 3,604,947 | 9/1971 | Puthuff | 328/167 X |
| 3,699,461 | 10/1972 | Huntsinger | 328/134 |
| 3,786,360 | 1/1974 | Kawa | 328/151 X |

*Primary Examiner*—John S. Heyman
*Attorney, Agent, or Firm*—Victor Myer; James W. Gillman

[57] ABSTRACT

A sampling filter-detector receives input signals of different frequencies and provides an output, or detect signal, only when the input frequency has a predetermined value essentially equal to the drive frequency of the sampling circuit. The input signal is coupled through a series of solid state switches, or multipliers, to storage, or sampling, capacitors, the average voltages of which are coupled through voltage peak and valley followers to a comparator which supplies an output or detect signal only when the difference between the positive and negative voltage inputs to the comparator is greater than a certain value. This occurs when the input frequency is within the detector bandwidth. A threshold voltage of a desired value may be placed in the circuit coupling the peak follower and the positive input of the comparator. The solid state switches are turned on and off by pulses from digital logic means such that the switches are on 120° apart in time for the drive frequency which is equal to the frequency to be detected by the filter detector. The response to the third harmonic of the input signal fundamental is eliminated as are multiples of the third harmonic.

12 Claims, 5 Drawing Figures

SAMPLING FILTER-DETECTOR

BACKGROUND OF THE INVENTION

The invention relates to sampling, or commutating, filter-detectors, more particularly to sampling filter-detectors utilizing capacitive storage, or sampling, means having an improved detecting means for the desired tone signal.

In mobile two-way radio communicating systems, for example, when one mobile energizes its transmitter by depressing the push to talk (PTT) switch all other mobile radios whose receivers are on and are tuned to the same carrier frequency will receive the transmission unless the audio portions of the receivers are squelched as is well known in this art. Mobile two-way radio communicating systems include a carrier or noise squelch which function to turn off or quiet the receiver when no carrier, and only noise, is being received. In addition to, or alternatively, such mobile two-way radio communicating systems include selective squelch circuitry which responds to some particular frequency. In the latter systems only those receivers adapted to respond to that particular (selected) frequency will unsquelch, or turn on audio, when the transmitting mobile depresses the PTT switch to transmit that frequency.

The circuit at the mobile receiver for detecting its particular frequency may be of the sampling filter-detector type according to the invention. Moreover the band pass of each filter should be relatively narrow so that there is small or minimal response at frequencies only slightly removed from the tuned frequency.

Sampling filter-detectors utilizing storage capacitors are known. However, these have been relatively complex and expensive in requiring band pass filters following the storage capacitors and post detection filtering all of which require the use of a substantial number of addition components such as capacitors. Moreover, the resultant detected signal was not of the best wave shape.

SUMMARY OF THE INVENTION

Accordingly, it is an object of the invention to provide an improved sampling filter-detector which is simple, low-cost, requires a minimum number of components and is of small size. It is a further object of the invention to provide an improved sampling filter-detector of the nature indicated which, except for the storage capacitors and the series resistance, can be completely integrated.

It is a further object of the invention to provide an improved sampling filter-detector of the nature indicated which overcomes the disadvantages of the prior art.

In carrying out the invention according to one form there is provided a sampling filter-detector circuit comprising an input signal circuit for certain frequencies including a fundamental frequency, resistor means in series with said input signal circuit and having an output, three multiplier, or switch, means whose inputs are connected to the output of the resistor means, each of the multiplier, or switch, means including an output and input, an individual capacitor connected to each of the outputs of the respective multipliers, or switches, each of the capacitors being connected to a reference voltage, means connected to each of the multipliers, or switches, for energizing the same in a succession of three equal intervals whose total duration equals the period of the fundamental frequency, a peak voltage follower having an input and an output, the input of which is connected to each of the capacitors, a voltage valley follower having an input and an output, the input of which is connected to each of the capacitors, and comparator means coupled to the output of the voltage peak follower and the output of the voltage valley follower for providing a detector output when one of the inputs of the peak and valley followers exceeds the other. For eliminating the third harmonic and multiples thereof the switches are actuated 120° apart at the fundamental frequency. The series combination of the resistor means and each of the capacitors provides a controllable degree of attenuation in the input circuit for frequencies differing from the fundamental frequency. A threshold voltage may be placed in the circuit, coupling the voltage peak follower and the positive input of the comparator for determining the threshold value at which an output is detected.

DESCRIPTION OF THE PREFERRED EMBODIMENT

Figure 1:
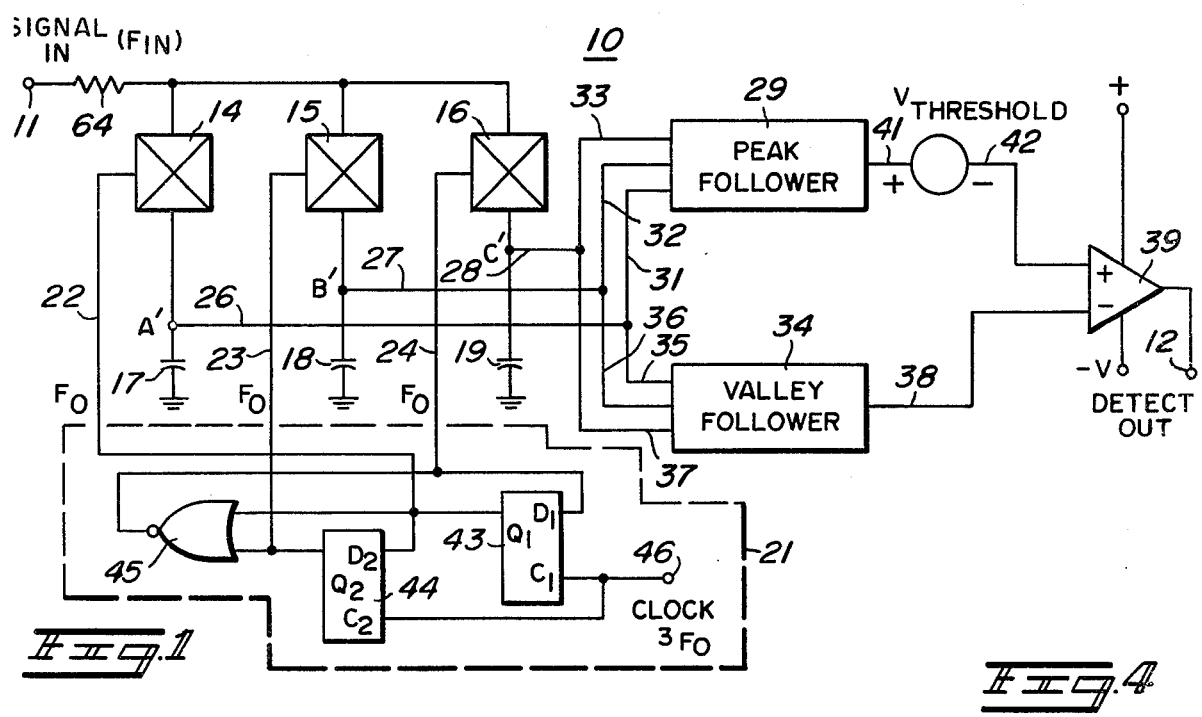
FIG. 1 is a block diagram of a sampling filter-detector circuit according to the invention.

Referring to the drawings there is shown in FIG. 1 a sampling filter-detector circuit 10 accepting a Signal In at terminal 11 and developing a Detect Out signal, as will be described, at terminal 12. The Signal In at terminal 11 which may be a sine wave 13 (FIG. 2) is sampled at 120° intervals by solid state switches, or multipliers, 14, 15, and 16 and the samples stored in capacitors 17, 18, and 19 respectively. The terminals of the capacitors opposite the switches are connected to a reference potential which, as shown, can be ground. The solid state switches 14, 15, and 16 are turned on and off at the appropriate time intervals by pulses developed in the digital logic means or circuitry 21 through conductors 22, 23, and 24 respectively.

The voltages appearing on capacitors 17, 18 and 19 are coupled through conductors 26, 27, and 28 to a voltage peak follower 29 through conductors 31, 32, and 33 and to a voltage valley follower 34 through conductors 35, 36, and 37. The output of the voltage valley follower 34 is coupled through a conductor 38 to the negative input of a differential amplifier 39 and the output of the voltage peak follower 29 is coupled through conductors 41 and 42 to the positive input terminal of differential amplifier 39. A voltage, $V_{Threshold}$, is connected between conductors 41 and 42 in order that the threshold at which the differential amplifier 39 will change from no signal at terminal 12 to a high signal at terminal 12 may be predetermined. Essentially the output at terminal 12 is a logical 0 or a logical 1 depending upon the value of the threshold, as will be more fully explained.

The digital logic means 21 comprises D flip-flops 43 and 44 and a nor gate 45 connected as shown and driven by a clock at terminal 46 with a frequency of $3F_0$.

Figure 3:
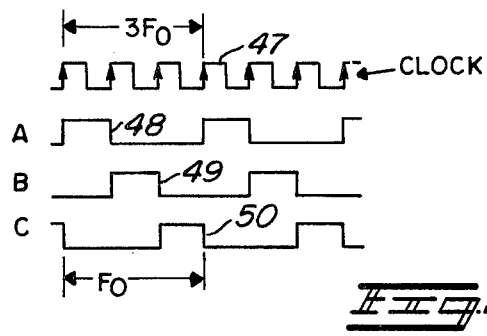
FIG. 3 is a series of timing wave shapes developed by a portion of the circuitry of FIG. 1.

Referring to FIG. 3 there are shown the timing wave forms A, B and C and the clock wave form, the wave forms i.e. pulses A, B, and C being transmitted, respectively, over conductors 22, 23, and 24 to control the closing and opening of the switches 14, 15 and 16, respectively. In each case the switch will be turned on when the pulses of the wave shapes A, B, and C rise, will remain on during the duration of the pulse and will be turned off when the pulse drops to 0. The turn on pulses can be considered as logical 1's and the turn off pulses as logical 0's in the digital logic circuitry. Thus it will be observed that the switches 14, 15, and 16 are on for successive intervals each equal to one-third of the period of the frequency $F_0$, the drive frequency, which is produced by a clock running at a frequency of $3F_0$.

The flip-flops 43 and 44 are well known types of devices with clock, or change states, on the rising portion of the clock pulses 47 as shown by the arrows thereon. The nor gate 45 is a well known component and functions with the flip-flops 43 and 44 to produce the rising pulses 48, 49, and 50 of wave forms A, B, and C. Each of the pulses 48, 49 and 50 is one-third of the wave length of the frequency $F_0$.

The clock frequency inputs at terminal 46 are applied to terminals $C_1$ and $C_2$ of the flip-flops 43 and 44, respectively. The flip-flops 43 and 44 each include a delay input $D_1$ and $D_2$ and outputs $Q_1$ and $Q_2$, respectively. The functioning of the flip-flops 43 and 44 together with the nor gate 45 is believed to be sufficiently well understood in this art without the requirement of illustrating the truth tables for these devices or other more detailed explanation in order to produce the wave shapes shown in FIG. 3. The function of the digital logic means 21 is to close solid state switches 14, 15, and 16 successively for 120° intervals at the frequency $F_0$ which for purposes of explanation is equal to the frequency $F_{IN}$ of the input signal.

In FIG. 2(a) there is shown one cycle of the input signal $F_{IN}$ and in FIG. 2(b) there are shown the pulses 48, 49 and 50 (also FIG. 3) which close, respectively, the solid state switches 14, 15, and 16 successively for 120° intervals. Inasmuch as the positive pulses turn on the switches, it will be observed that switch 14 is closed for 120° and open for the remainder of the cycle, followed by switch 15 being closed by pulse 49 for the next 120° and open for the remainder of the cycle and the portion before the pulse and finally switch 16 is closed by pulse 50 for the next succeeding 120° of the cycle, switch 16 having been open for the first 240° of the cycle. For purposes of explanation it has been assumed that the phase of the input signal $F_{IN}$ is the same as that of the drive signal $F_0$, and that any transient conditions are not present.

During the initial 120° interval (length of pulse 48) the capacitor 17 is charged to some positive average value $V_A$ (FIG. 2a). Similarly during the next or succeeding 120° interval the switch 14 is opened but the switch 15 is closed by the pulse 49 and causes the capacitor 18 to assume a charge of some average value. For the case assumed of $F_{IN}$ and $F_0$ being in phase the positive and negative portions of the input wave $F_{IN}$ are equal and the net average charge on capacitor 18, $V_B$, is zero. Duing the next succeeding 120° interval the solid state switches 14 and 15 are both opened and only the switch 16 is closed by the pulse 50. During this interval the capacitor 19 is charged to some negative average value $V_C$ as shown in FIG. 2(a). The difference voltage $V_D$ is the sum of $V_A$ and $V_C$ for the case shown. While one wave shape is shown in FIG. 2(a) it is understood, of course, that the process goes on at the drive frequency for what ever interval of time during which the capacitors 17, 18 and 19 assume their average charges. The capacitors hold the charge which is placed thereon during each of the 120° intervals throughout the cycle. Comparing the average voltages $V_A$, $V_B$, and $V_C$ of FIG. 2(a), for $F_{IN}$ and $F_0$ being in phase, it will be evident that when the phase changes between $F_{IN}$ and $F_0$ the average voltages across the capacitors 17, 18 and 19 will change accordingly.

Figure 4:
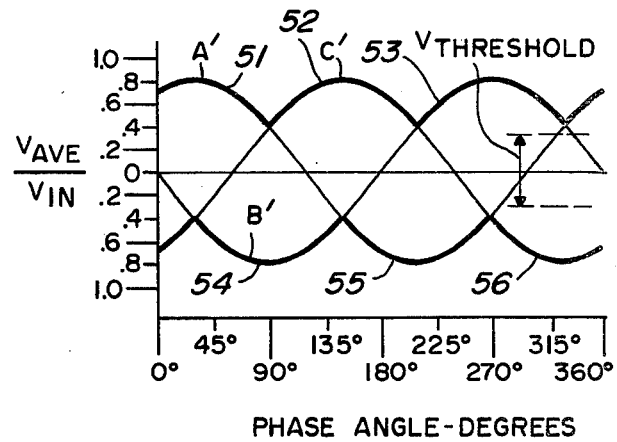
FIG. 4 is a series of wave shapes showing average voltage developed across the sampling capacitors plotted against phase angle between input signal and drive signal.

In FIG. 4, there are shown graphs of the average voltages appearing across capacitors 17, 18 and 19, i.e., wave shapes A', B', and C' respectively, from in phase (0°) to 360° out of phase. These wave shapes are achieved, respectively, by the pulses A, B, and C. The voltages are shown plotted in a normalized manner as $V_{AVE}/V_{IN}$ ($V_{average}$ over $V_{IN}$). While these wave shapes are essentially of sine wave form it will be observed that the waves intersect each other (they are 120° out of phase) and the upper portions form peaks 51, 52, and 53, and the lower portions form valleys 54, 55, and 56.

While the peak voltages follow the peaks 51, 52, and 53 and the valley voltages follow the valleys 54, 55, and 56, the difference between the peaks and valleys at any phase angle remains essentially the same, there being only a relatively small ripple therein. Thus throughout the whole cycle of 360° phase variations the voltage difference between the peaks and valleys is essentially constant. Thus there will be no detect output voltages at terminal 12 occuring as a result of phase variations between the incoming signal $F_{IN}$ and the drive signal $F_0$ when $F_{IN}$ and $F_0$ are equal.

The voltage peak follower 29, which may be of any well known type, but could be a series of appropriately poled diodes, follows the peak voltages 51, 52 and 53 as received over the conductors 31, 32 and 33, providing a plus output voltage at conductor 41. The voltage valley follower 34, which also may be of any well known type, for example, a series of properly poled diodes follows the voltage valleys 54, 55, and 56 as received over the conductors 35, 36 and 37, providing a negative output voltage at conductor 38. The difference between the valley voltages and the peak voltages as modified by the threshold voltage, $V_{threshold}$, also shown in FIG. 4, is applied to the negative and positive terminals of the high gain amplifier 39 as already explained. In FIG. 4 the $V_{threshold}$ is shown having an upper value slightly less than the minimum of the peak voltages and a lower value somewhat greater than the maximum of the valley voltages. The threshold can be selected to be any desired value such that when the difference between the peak voltages and valley voltages exceeds the threshold the amplifier 39 will supply a detect signal. When the difference between the peak voltages and the valley voltages is less than the threshold there will be no detect output signal at terminal 12. In other words when the frequency of the input signal is within the band width, which it is whenever $F_{IN}$ equals $F_0$ and for a band on each side of this frequency, as will be further explained, there will be an output signal which can be a logical 1. Whenever the input signal is not within the band width the difference between the peak voltages and valley voltages will be less than the necessary differential and the output of the amplifier will be low or a logical 0. The response of the filter is thus very sharp. For a desired frequency a high response and for undesired frequencies a zero response.

Figure 5:
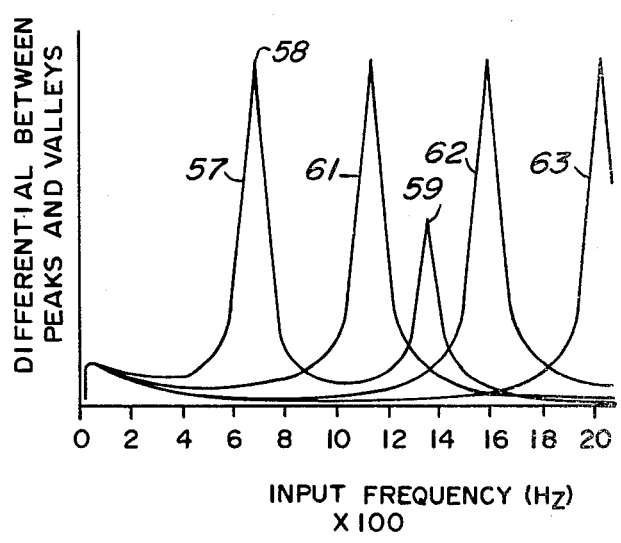
FIG. 5 is a series of wave shapes illustrating the differential between the peaks and valleys of the voltages shown in FIG. 4 as a function of input frequency.

In FIG. 5 there is shown a plot of the differential between the peaks and valleys of FIG. 4 against the input frequency $F_{IN}$. The differential voltages of FIG. 5 are those appearing at the inputs to the voltage peak follower 29 and the voltage valley follower 34. For one particular input frequency, 675 Hz, which may be a typical signalling frequency in a two-way radio system the differential is shown as the curve 57. The peak 58 of curve 57 occurs at the frequency of 675 Hz which is the input signal for $F_{IN}$, and occurs when the drive frequency $F_0$ also equal 675 Hz which is to say that the input frequency is precisely at the mid-point of the frequency band. For this indication the clock frequency at terminal 46 is of course 2025 Hz. As the frequency of the input signal $F_{IN}$ decreases and increases relative to the drive frequency $F_0$ the response curve 57 is obtained. It will be noted that the sides of curve 57 fall very steeply indicating a very narrow band width with a secondary peak 59 at the second harmonic frequency of 1350 Hz, but at the third harmonic frequency of 2025 Hz, the response is zero indicating that there is no third harmonic voltage in the output of the sampling circuit. This is a very desirable feature and is a consequence of the three phase or 120° relationship of the solid state switch operation. The response curves 61, 62 and 63 are shown for different frequencies of the signal in, the curve 63 being at a frequency of 2025 Hz as already indicated. These curves, of course, were obtained by having $F_0$ equal to the indicated frequencies while the clock frequency was three times as great. The peak amplitudes are essentially the same here respective of the input frequency value.

The bandwidths of the responses shown in FIG. 5 are determined by the magnitude of the resistor 64 connected into the input circuit and the capacitive values of the sampling capacitors 17, 18 and 19. The resistor and the capacitor form an attenuating circuit which rapidly attenuates the output when the input frequency varies from the desired or fundamental frequency. In a particular case the resistor had a value of 15K ohms and the capcitors 17, 18 and 19 each had a value of 0.1 $\mu f$. Other values for particular conditions may of course be selected.

Figure 2:
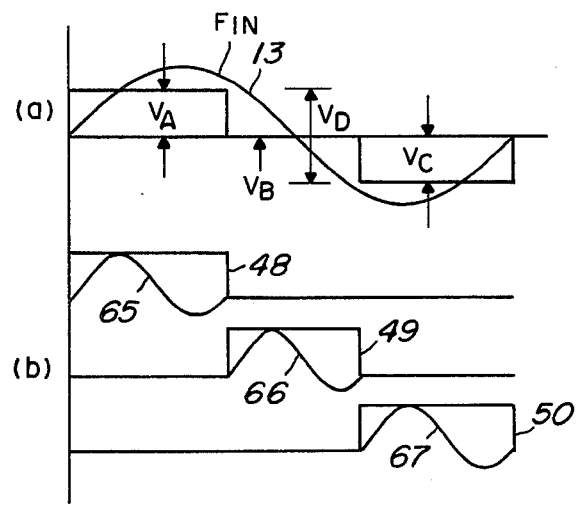
FIG. 2 is a series of wave shapes useful in explaining the operation of a portion of the circuitry of FIG. 1.

Referring to FIG. 2 (b) there are shown three sine waves 65, 66 and 67 each existing respectively in the intervals defined by the pulses 48, 49 and 50 which are 120° out of phase with each other, are equal in length to each other and in total correspond to the wave length of the input frequency. During the interval defined by pulse 48 which is when the switch 14 is closed the sine wave 65 averages to zero. Similarly for the intervals of pulses 49 and 50 when switches 15 and 16 are closed the sine waves 66 and 67 average to zero. Thus it may be understood that the sampling filter does not produce any harmonic output for which, during the appropriate time interval when the particular switch is closed, the harmonics average to zero.

The pulses 48, 49 and 50 together with their zero portions may be defined as a function of time S(Y). The pulses 48, 49 and 50 may be considered a logical 1's and the zero portions may of course be considered logical 0's. The waves 65, 66 and 67 are sine waves which may be represented as a function of time equal to sin (Z). When the integral of the product of the two functions that is the integral of S(Y) times sin (Z) has an average value equal to zero then the response for that frequency is zero. That is, the average value of $\int S(Y) \sin (Z)$ equals zero.

The solid state switches, or multipliers, 14, 15 and 16 may be field effect transistors or bipolar transistors or other devices known to those skilled in the art.

All of the components described, except for the resistor 64 and the capacitors 17, 18 and 19 can readily be realized in integrated form.

While a preferred embodiment of the invention has been disclosed, it will be apparent that many forms are possible within the true spirit and scope of the invention.

I claim:

1. A sampling filter-detector circuit comprising an input signal circuit for certain frequencies including a fundamental frequency, resistor means in series with said input signal circuit and having an output, three multiplier means connected to the output of the resistor means, each of said multiplier means including an output and a multiplier input, an individual capacitor connected to each of the outputs of the respective multiplier, each of said capacitors being connected to a reference voltage, means connected to each of said multipliers for energizing same in a succession of three equal intervals whose total duration equals the period of said fundamental frequency, a peak voltage follower having an input and an output, the input of which is connected to each of said capacitors, a valley voltage follower having an input and an output the input of which is connected to each of said capacitors, and comparator means coupled to the output of said peak follower and the output of said valley follower for providing a detector output when one of the outputs of said peak and valley followers exceeds the other.

2. The sampling filter-detector circuit according to claim 1 wherein the series combination of said resistor means and each of said capacitors provides a controllable degree of attenuation in said circuit for frequencies differing from said fundamental frequency.

3. The sampling filter-detecting circuit according to claim 1 wherein a threshold deterining means is provided in one of the inputs to said comparator.

4. The sampling filter-detecting circuit according to claim 3 wherein said threshold determining means is in the positive input to said comparator.

5. The sampling filter-detecting circuit according to claim 1 wherein said comparator comprises a differential amplifier.

6. The sampling filter-detecting circuit according to claim 5 wherein said differential amplifier has high gain and provides essentially a zero output for equal or negative inputs and a substantial output for a net positive input.

7. The sampling filter-detecting circuit according to claim 1 wherein said multiplier energizing means comprising digital logic means.

8. A sampling filter-detecting circuit comprising an input signal circuit for certain frequencies including a fundamental frequency, a plurality of capacitors coupled between said input signal circuit and a reference voltage, switch means connected in the coupling circuit of each of said capacitors between said input signal circuit and the respective capacitors, timing circuit means for controlling said switch means in a predetermined relationship to said fundamental frequency, peak and valley voltage follower means coupled to said capacitors and comparator means coupled to the outputs of said peak and valley voltage follower means for providing a detector output when the output of one of said peak and valley followers exceeds the other.

9. The sampling filter-detector according to claim 8 wherein the number of capacitors is selected and the timing circuit controls the closed and open periods of the switch means relative to a predetermined harmonic of said fundamental that the integral of the harmonic wave shape to each capacitor is zero over the period of switch closed.

10. The sampling filter-detector according to claim 8 wherein said timing circuit comprising digital logic means.

11. The sampling filter-detector according to claim 9 wherein the number of capacitors is three, the predetermined harmonic is of the fundamental is the third and each switch means is cyclically controlled to be closed one-third of the period and open two-thirds of the period of the fundamental frequency.

12. The sampling filter-detector according to claim 10 including a series resistor in the input circuit and the combination of said resistor and each of said capacitors provides a circuit having high attentuation at frequencies differing from said fundamental.

* * * * *